(12) United States Patent
Toprac et al.

(10) Patent No.: US 6,304,999 B1
(45) Date of Patent: Oct. 16, 2001

(54) METHOD AND APPARATUS FOR EMBEDDED PROCESS CONTROL FRAMEWORK IN TOOL SYSTEMS

(75) Inventors: Anthony John Toprac; Elfido Coss, Jr., both of Austin, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 09/694,139

(22) Filed: Oct. 23, 2000

(51) Int. Cl.[7] .................................................. G06F 17/50
(52) U.S. Cl. ...................................... 716/4; 716/17
(58) Field of Search ................................ 716/4, 17

(56) References Cited

U.S. PATENT DOCUMENTS 6,096,091 * 8/2000 Hartmann .................. 716/17
6,182,247 * 1/2001 Hermann et al. ........... 716/4

* cited by examiner

*Primary Examiner*—Trong Phan
(74) *Attorney, Agent, or Firm*—Williams, Morgan & Amerson (57) ABSTRACT

The present invention provides for a method and an apparatus for implementing an embedded process control into a manufacturing tool system. At least one semiconductor device is processed. An embedded process control procedure is performed in response to the processing of the semiconductor device. A subsequent process of semiconductor device is performed in response to the embedded process control procedure. The apparatus of the present invention comprises: a computer system; and at least one manufacturing tool system interfaced with the computer, the manufacturing tool system comprising an embedded process control system capable of receiving commands from the computer system and control a manufacturing process performed by the manufacturing tool system.

23 Claims, 7 Drawing Sheets

METHOD AND APPARATUS FOR EMBEDDED PROCESS CONTROL FRAMEWORK IN TOOL SYSTEMS

BACKGROUND OF THE INVENTION

1. Field of the Invention

This invention relates generally to semiconductor manufacturing, and, more particularly, to a method and apparatus for using embedded process control in manufacturing tool systems.

2. Description of the Related Art

The technology explosion in the manufacturing industry has resulted in many new and innovative manufacturing processes. Today's manufacturing processes, particularly semiconductor manufacturing processes, call for a large number of important steps. These process steps are usually vital, and therefore, require a number of inputs that are generally fine tuned to maintain proper manufacturing control.

The manufacture of semiconductor devices requires a number of discrete process steps to create a packaged semiconductor device from raw semiconductor material. The various processes, from the initial growth of the semiconductor material, the slicing of the semiconductor crystal into individual wafers, the fabrication stages (etching, doping, ion implanting, or the like), to the packaging and final testing of the completed device, are so different from one another and specialized that the processes may be performed in different manufacturing locations that contain different control schemes.

Among the factors that affect semiconductor device manufacturing are wafer-to-wafer variation that are caused by manufacturing problems that include start-up effects of manufacturing machine tools, memory effects of manufacturing chambers, and first-wafer effects. One of the process steps that are adversely affected by such factors is the photolithography overlay process. Overlay is one of several important steps in the photolithography area of semiconductor manufacturing. Overlay control involves measuring the misalignment between two successive patterned layers on the surface of a semiconductor device. Generally, minimization of misalignment errors is important to ensure that the multiple layers of the semiconductor devices are connected and functional. As technology facilitates smaller critical dimensions for semiconductor devices, the need for reduced of misalignment errors increases dramatically.

Generally, photolithography engineers currently analyze the overlay errors a few times a month. The results from the analysis of the overlay errors are used to make updates to exposure tool settings manually. Some of the problems associated with the current methods include the fact that the exposure tool settings are only updated a few times a month. Furthermore, currently the exposure tool updates are performed manually.

Generally, a set of processing steps is performed on a lot of wafers on a semiconductor manufacturing tool called an exposure tool or a stepper. The manufacturing tool communicates with a manufacturing framework or a network of processing modules. The manufacturing tool is generally connected to an equipment interface. The equipment interface is connected to a machine interface to which the stepper is connected, thereby facilitating communications between the stepper and the manufacturing framework. The machine interface can generally be part of an advanced process control (APC) system. The APC system initiates a control script, which can be a software program that automatically retrieves the data needed to execute a manufacturing process. The input parameters that control the manufacturing process are revised periodically in a manual fashion. As the need for higher precision manufacturing processes are required, improved methods are needed to revise input parameters that control manufacturing processes in a more automated and timely manner. Furthermore, wafer-to-wafer manufacturing variations can cause non-uniform quality of semiconductor devices.

Although current process control systems provide for some coarse-tuning of manufacturing controls, the industry lacks an efficient means of performing fine-tuning of manufacturing controls. The present control systems are generally responsible for a plurality of manufacturing sections. These control systems are generally not capable of refining manufacturing processes at an in-depth level.

The present invention is directed to overcoming, or at least reducing the effects of, one or more of the problems set forth above.

SUMMARY OF THE INVENTION

In one aspect of the present invention, a method is provided for implementing an embedded process control into a manufacturing tool system. At least one semiconductor device is processed. An embedded process control procedure is performed in response to the processing of the semiconductor device. A subsequent process of semiconductor device is performed in response to the embedded process control procedure.

In another aspect of the present invention, an apparatus is provided for implementing an embedded process control into a manufacturing tool system. The apparatus of the present invention comprises: a computer system; and at least one manufacturing tool system interfaced with the computer, the manufacturing tool system comprising an embedded process control system capable of receiving commands from the computer system and control a manufacturing process performed by the manufacturing tool system.

BRIEF DESCRIPTION OF THE DRAWINGS

The invention may be understood by reference to the following description taken in conjunction with the accompanying drawings, in which like reference numerals identify like elements, and in which.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

There are many discreet processes that are involved in semiconductor manufacturing. Many times, semiconductor devices are stepped through multiple manufacturing process tools. Wafer-to-wafer variations can result in an output of non-uniform semiconductor devices. One process that is affected by is the photolithography overlay process. Overlay process is an important step in semiconductor manufacturing. In particular, overlay process involves measuring misalignment errors between semiconductor layers during manufacturing processes. Improvements in the overlay process could result in substantial enhancements, in terms of quality and efficiency, in semiconductor manufacturing processes. The present invention provides a method of implementing automated error correction for wafer-to-wafer variations.

Figure 1:
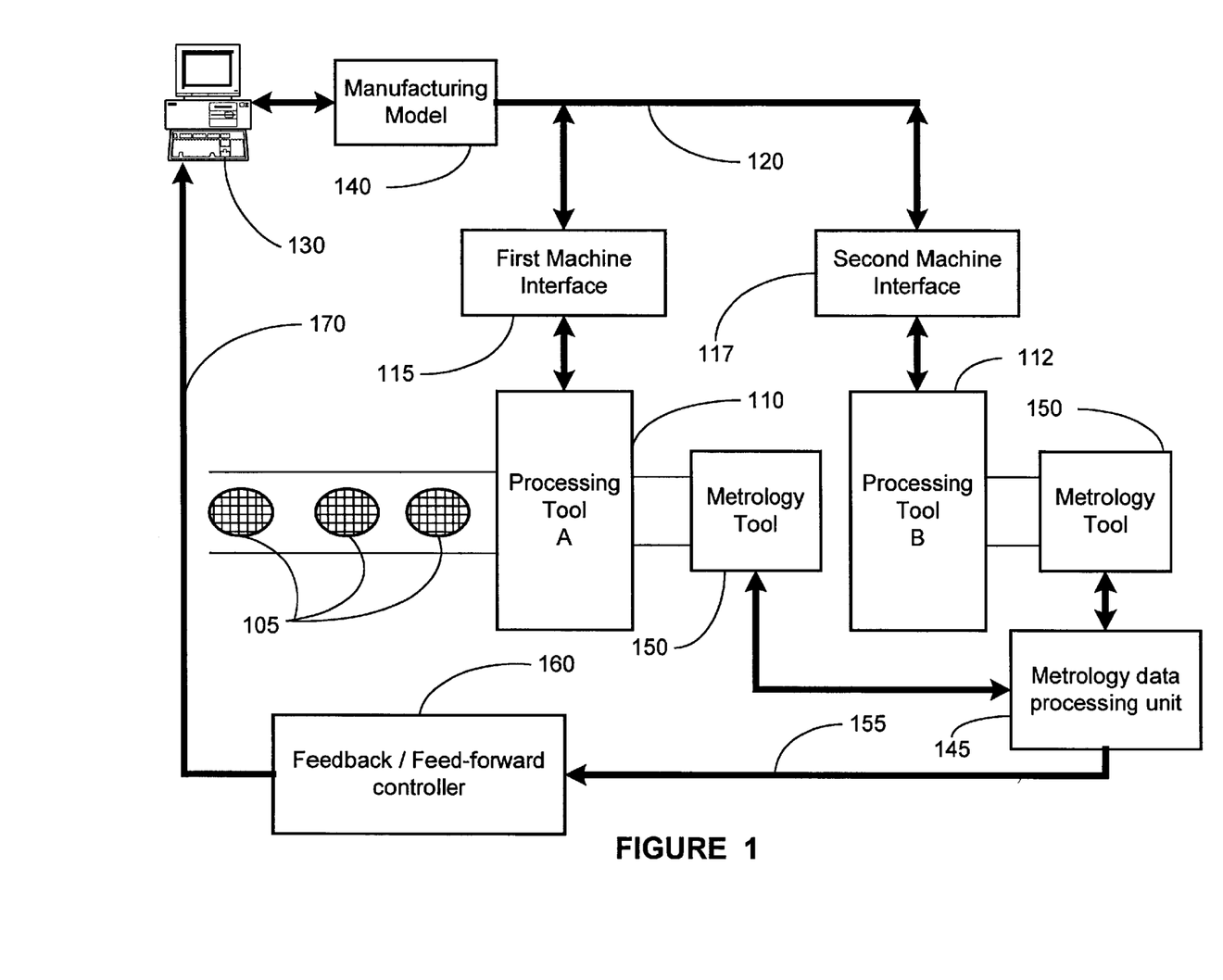
FIG. 1 illustrates one embodiment of a manufacturing process control system.

Semiconductor devices are processed in a manufacturing environment using a number of input control parameters. Turning now to FIG. 1, one embodiment of the present invention is illustrated. In one embodiment, semiconductor products 105, such as semiconductor wafers are processed on processing tools 110, 112 using a plurality of control input signals on a line 120. In one embodiment, the control input signals on the line 120 are sent to the processing tools 110, 112 from a computer system 130 via machine interfaces 115, 117. In one embodiment, the first and second machine interfaces 115, 117 are located outside the processing tools 110, 112. In an alternative embodiment, the first and second machine interfaces 115, 117 are located within the processing tools 110, 112.

In one embodiment, the computer system 130 sends control input signals on a line 120 to the first and second machine interfaces 115, 117. The computer system 130 employs a manufacturing model 140 to generate the control input signals on the line 120. In one embodiment, the manufacturing model contains a recipe that determines a plurality of control input parameters that are sent on the line 120.

In one embodiment, the manufacturing model 140 defines a process script and input control that implement a particular manufacturing process. The control input signals on a line 120 that are intended for processing tool A 110 are received and processed by the first machine interface 115. The control input signals on a line 120 that are intended for processing tool B 112 are received and processed by the second machine interface 117. Examples of the processing tools 110, 112 used in semiconductor manufacturing processes are steppers, scanners, step-and-scan tools, and etch process tools. In one embodiment, processing tool A 110 and processing tool B 112 are photolithography process tools, such as steppers.

One or more of the semiconductor wafers that are processed by the processing tools 110, 112 are generally sent to a metrology tool 150 for acquisition of metrology data. In one embodiment, the metrology tool 150 is a scatterometry data acquisition tool, or a scatterometer. Data from the metrology tool 150 is processed and organized by the metrology data processing unit 145. In one embodiment, the metrology data processing unit 145 correlates the metrology data to a particular manufacturing lot of processed semiconductor wafers. In one embodiment, the metrology data processing unit 145 is integrated into the computer system 130. In one embodiment, the metrology data processing unit 145 is a computer software program embedded into the computer system 130, wherein the computer system 130 is integrated within the APC framework.

The processed metrology data, which in one embodiment is scatterometry data, from the metrology data processing unit 145 is sent to a feedback/feed-forward controller 160 on a line 155. In one embodiment, the feedback/feed-forward controller 160 process the scatterometry data and generates feedback and feed-forward adjustment data that are known by those skilled in the art. The feedback and feed-forward adjustment data, described below, is sent to the computer system 130 via a line 170. The computer system 130 utilizes the feedback and feed-forward adjustment data to make modifications in the manufacturing model 140, which causes appropriate changes in the control input parameters on the line 120. In one embodiment, the feedback/feed-forward controller 160 is integrated into the computer system 130. In one embodiment, the feedback/feed-forward controller 160 is a computer software program embedded into the computer system 130.

Among the bases for modifying the control input signal on the line 120 are metrology measurements performed on processed semiconductor wafers, such as scatterometry measurements. The metrology measurements are used to perform a feedback modification and a feed-forward modification of the control input signals. Generally, the feedback modification of the control input signals on the line 120 are performed on photolithography processes, such as line width adjustments using photo exposure dosages and line profile adjustments using exposure focus modifications. Feedback modification of the control input signal on the line 120 can also be performed on etch processes, such as etch line shape adjustments using etch recipe modifications.

Feed-forward modification of the control input signals on the line 120 can be used to perform corrections of subsequent processes on the semiconductor wafers. Feed-forward modification of the control input signals on the line 120 can be used in spacer deposition processes, where scatterometry techniques can be used to adjust effective line widths of precision forms on semiconductor wafers. In one embodiment, in a spacer deposition process, scatterometry measurements can be used to adjust deposition time, which may impact the spacer width, which in turn would impact the effective line width of a trace on a semiconductor wafer. Furthermore, scatterometry measurements can be used measure the ion implantation parameters and adjust ion implant dosage on subsequent ion implant processes.

In the context of a manufacturing process such as a stepper process, the control inputs on the line 120 that are used to operate the processing tool 110 include an x-translation signal, a y-translation signal, an x-expansion wafer scale signal, a y-expansion wafer scale signal, a reticle magnification signal, and a reticle rotation signal. Generally, errors associated with the reticle magnification signal and the reticle rotation signal relate to one particular exposure process on the surface of the wafer being processed in the exposure tool. One of the primary features taught by the present invention is a method of updating control input signals on the line 120 in response to an analysis of external variables.

When a process step in the processing tool 110 is concluded, the semiconductor wafer that is being processed in the processing tool 110 is examined in a review station, as described in block 120 of FIG. 1. One such review station is a KLA review station. One set of data derived from the operation of the review station is a quantitative measure of the amount of misregistration that was caused by the previous exposure process. In one embodiment, the amount of misregistration relates to the misalignment in the process that occurred between two layers of a semiconductor wafer. In one embodiment, the amount of misregistration that occurred can be attributed to the control inputs to a particular exposure process. The control inputs generally affect the accuracy of the process steps performed by the exposure tools on the semiconductor wafer. The control input signals affect the reticle magnification and the position of the semiconductor wafer that is being processed. Modifications of the control inputs can be utilized to improve the performance of the process steps employed in the exposure tool. In one embodiment, the modifications to the control input signals on the line 120 are based on the effects of external variables on the semiconductor devices being processed. The present invention provides for a method and an apparatus for performing the process control described above, wherein the process control system is embedded within a manufacturing tool system.

Figure 2:
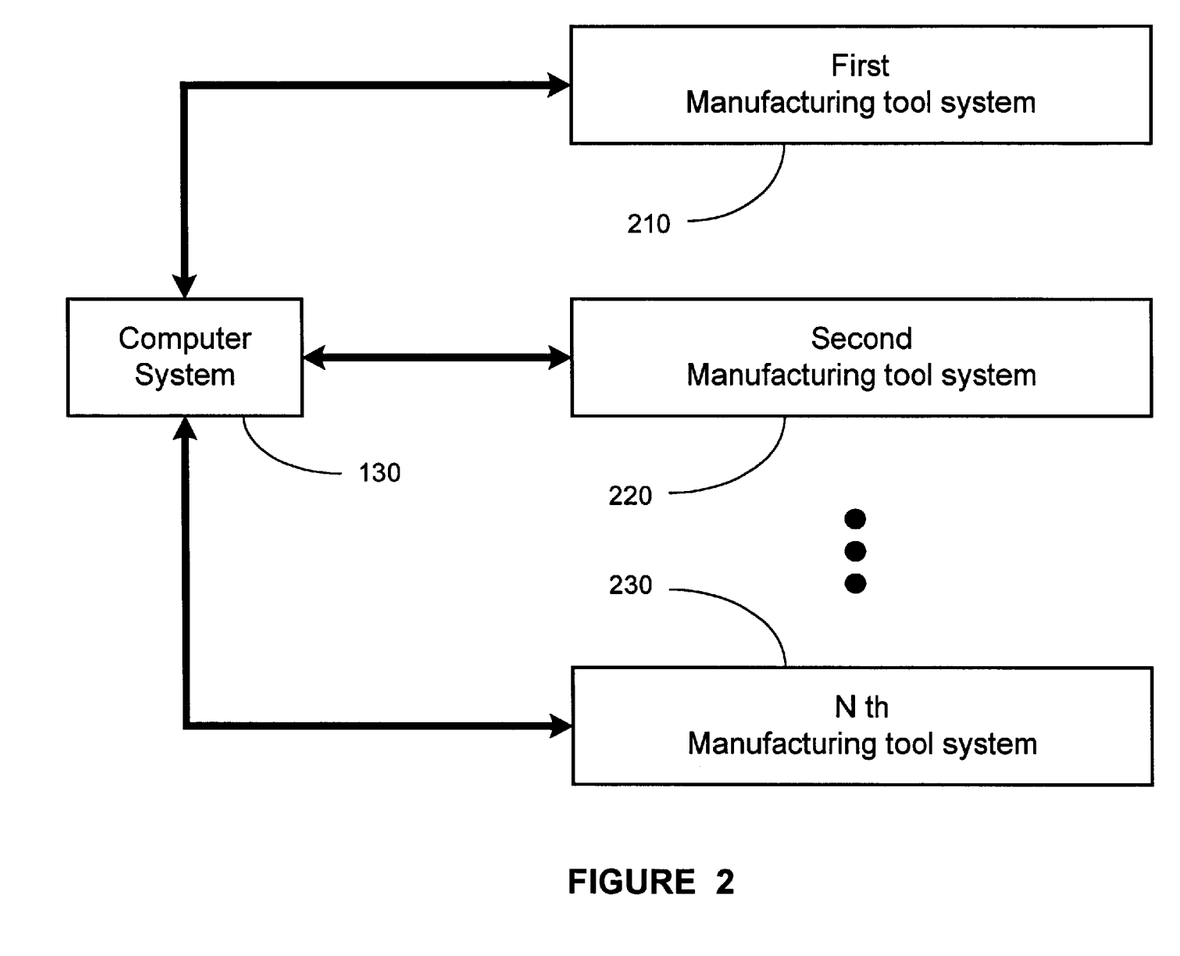
FIG. 2 illustrates one embodiment of an apparatus in accordance with the present invention.

Turning now to FIG. 2, an apparatus in accordance with the present invention is illustrated. The computer system 130 is interfaced with a first manufacturing tool system 210, a second manufacturing tool system 220, and an Nth manufacturing tool system 230. In one embodiment, individual process control systems are integrated or embedded into each of the first through Nth manufacturing tool systems 210, 220, 230. For purposes of clarity, the details of the first manufacturing system 210 will be described. However, it is to be understood by one skilled in the art that the second through Nth manufacturing systems 220, 230 are substantially similar to the first manufacturing system 210. The embedding of a process control system allows for fine-tune process control, such as wafer-to-wafer error corrections.

Figure 3:
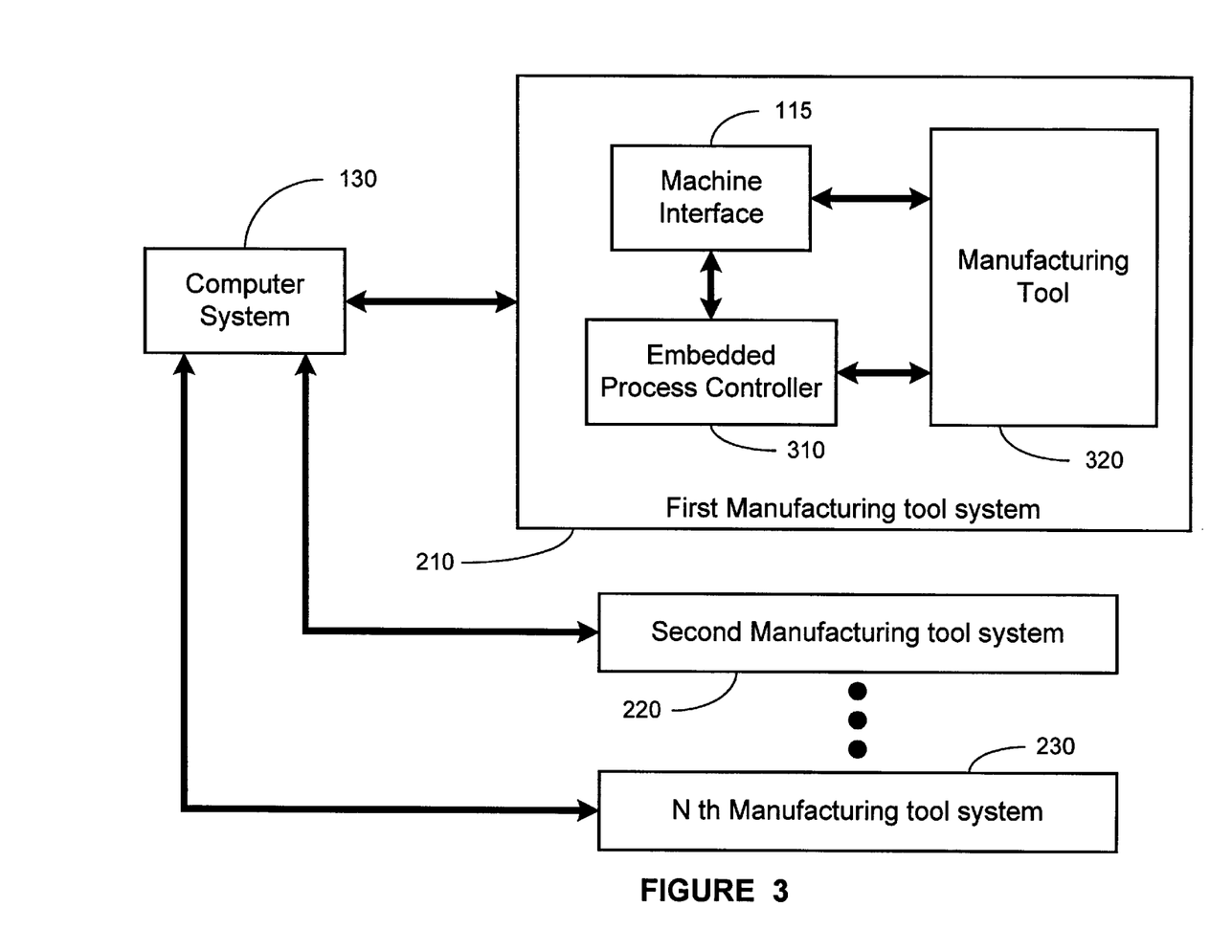
FIG. 3 illustrates a more detailed depiction of one embodiment of a manufacturing tool system described in FIG. 2.

Turning now to FIG. 3, a more detailed depiction of the first manufacturing tool system 210 is illustrated. The first manufacturing tool system 210 comprises a machine interface 115, an embedded process controller 310, and a manufacturing tool 320. The computer system 130 is interfaced with the machine interface 115 and the embedded process controller 310. In one embodiment, the embedded process controller 310 is capable of performing feedback/feed-forward modifications during the operation of the manufacturing tool 320. Furthermore, the embedded process controller 310 is capable of performing fine-tune adjustment in the operation of the manufacturing tool 320 on a wafer-to-wafer basis. In other words, control parameter modification in the manufacturing tool 320 can be performed between processing of each semiconductor wafer, thereby producing a manufacturing lot of semiconductor wafers that are of a higher quality.

In one embodiment, the embedded process controller 310 is capable of performing modifications in the operation of the manufacturing tool 320 via the machine interface 115. Furthermore, the computer system 130 can be used to affect the operation of the manufacturing tool 320 via the embedded process controller 320 or via directly though the machine interface 115. The first manufacturing tool system 210 is generally capable of independently performing process control, similar to the APC system, within the first manufacturing tool system 210. The second through the manufacturing tool system 220, 230 operate in a manner that is similar to the operation of the first manufacturing tool system 210.

Figure 4:
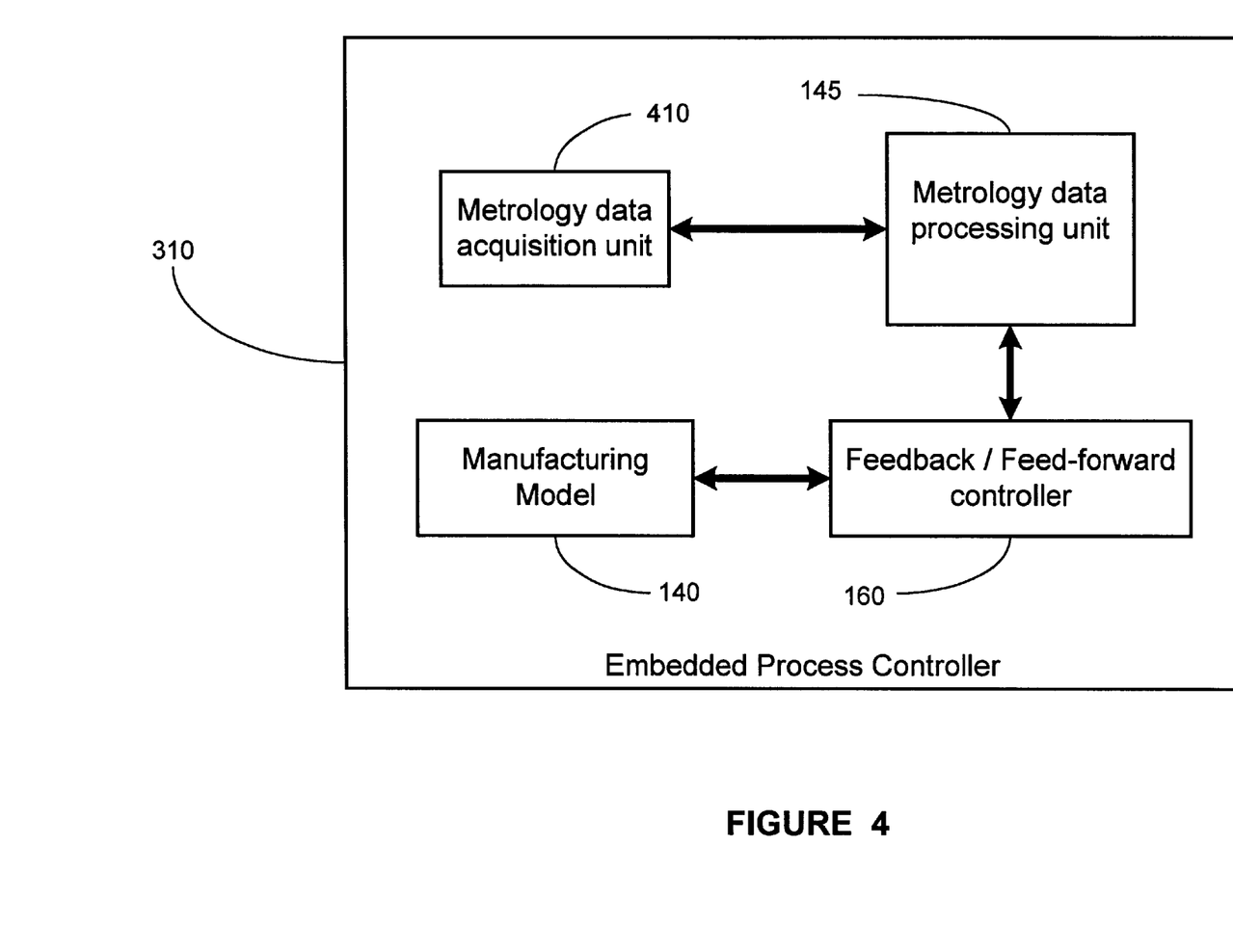
FIG. 4 illustrates a more detailed depiction of one embodiment of an embedded process controller described in FIG. 3.

Turning now to FIG. 4, a more detailed depiction of one embodiment of the embedded process controller 310 is illustrated. In one embodiment, the embedded process controller 310 comprises a metrology data acquisition unit 410, a metrology data processing unit 145, a feedback/feed-forward controller 160, and a manufacturing model 140. In one embodiment, the metrology data acquisition unit 410 is a metrology tool 150 that is capable of acquiring metrology data on a wafer-to-wafer basis. Data from the metrology data acquisition unit 410 is processed and organized by the metrology data processing unit 145. In one embodiment, the metrology data processing unit 145 correlates the metrology data to a particular semiconductor wafers that is being processed.

The metrology data acquisition unit 410 is interfaced with the feedback/feed-forward controller 160. The processed metrology data from the metrology data processing unit 145 is sent to a feedback/feed-forward controller 160. In one embodiment, the feedback/feed-forward controller 160 process the processed metrology data and generates feedback and feed-forward adjustment data that are known by those skilled in the art. The embedded process controller 310 utilizes the feedback and feed-forward adjustment data to make modifications in the manufacturing model 140, which causes appropriate changes in the control input parameters that control the operation of the manufacturing tool 320.

Generally, the feedback modification of the control input parameters are performed on photolithography processes, such as line width adjustments using photo exposure dosages and line profile adjustments using exposure focus modifications. Feedback modification of the control input parameters can also be performed on etch processes, such as etch line shape adjustments using etch recipe modifications. Feed-forward modification of the control input parameters may be used to perform corrections of subsequent processes on the semiconductor wafers. Feed-forward modification of the control input signals on the line 120 can be used in spacer deposition processes, where scatterometry techniques can be used to adjust effective line widths of precision forms on semiconductor wafers.

In one embodiment, the acquisition of metrology data, the processing of the acquired metrology data, the generation of feedback and feed-forward data, and the modification of control input parameters are performed by the embedded process controller 310 on a wafer-to-wafer basis; however, these processes can be performed on a lot-by-lot basis as well. As an illustrative example, during a film deposition process of a semiconductor wafer, the manufacturing model may define a recipe that calls for a deposition step duration of 10 seconds for achieving a 100 Angstrom thickness of film deposit. If data acquired after the processing of a semiconductor wafers reveals that a deposition step duration of 10 seconds produces a 105 Angstrom thickness of film deposit, the feedback/feed-forward controller 160 can modify the recipe in the manufacturing model 140 before the processing of the next semiconductor wafer. The recipe in the manufacturing model 140 can be modified such that a deposition step duration of 9.8 seconds is implemented on the next semiconductor wafer that is processed, in order to achieve a film deposition thickness of 100 Angstrom. In one embodiment, the embedded process controller 310 is an APC framework.

Figure 5:
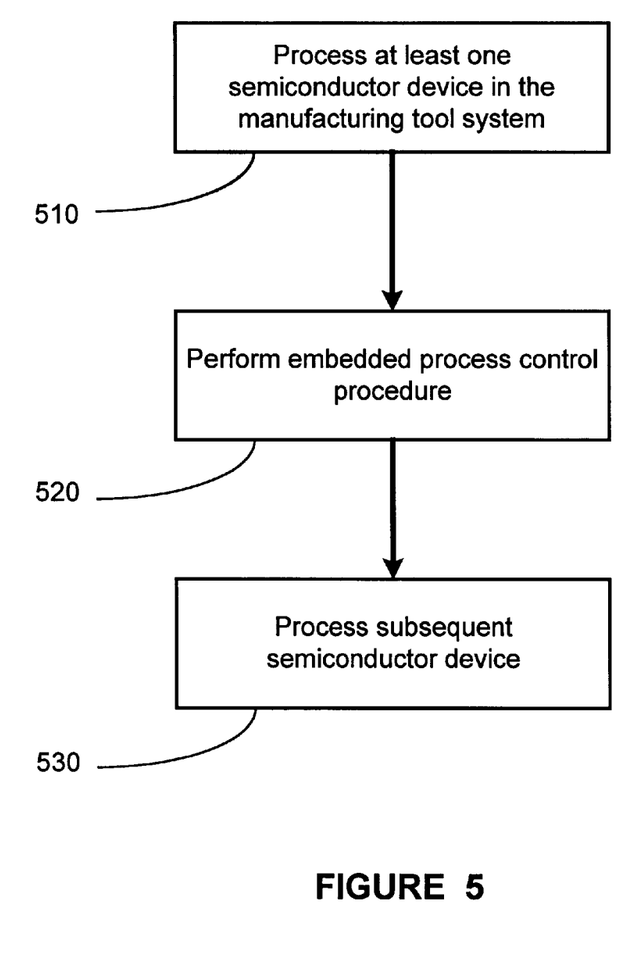
FIG. 5 illustrates a flowchart depiction of the method in accordance with the present invention.

Turning now to FIG. 5, a flowchart depiction of one embodiment of the methods in accordance with the present invention is illustrated. At least one semiconductor wafer is processed by the manufacturing tool system 210, as described in block 510 of FIG. 5. After at least one semiconductor wafer is processed, an embedded process control procedure is performed, as described in block 520 of FIG. 5. A more detailed flowchart depiction of the embedded process control procedure is illustrated in FIG. 6.

Figure 6:
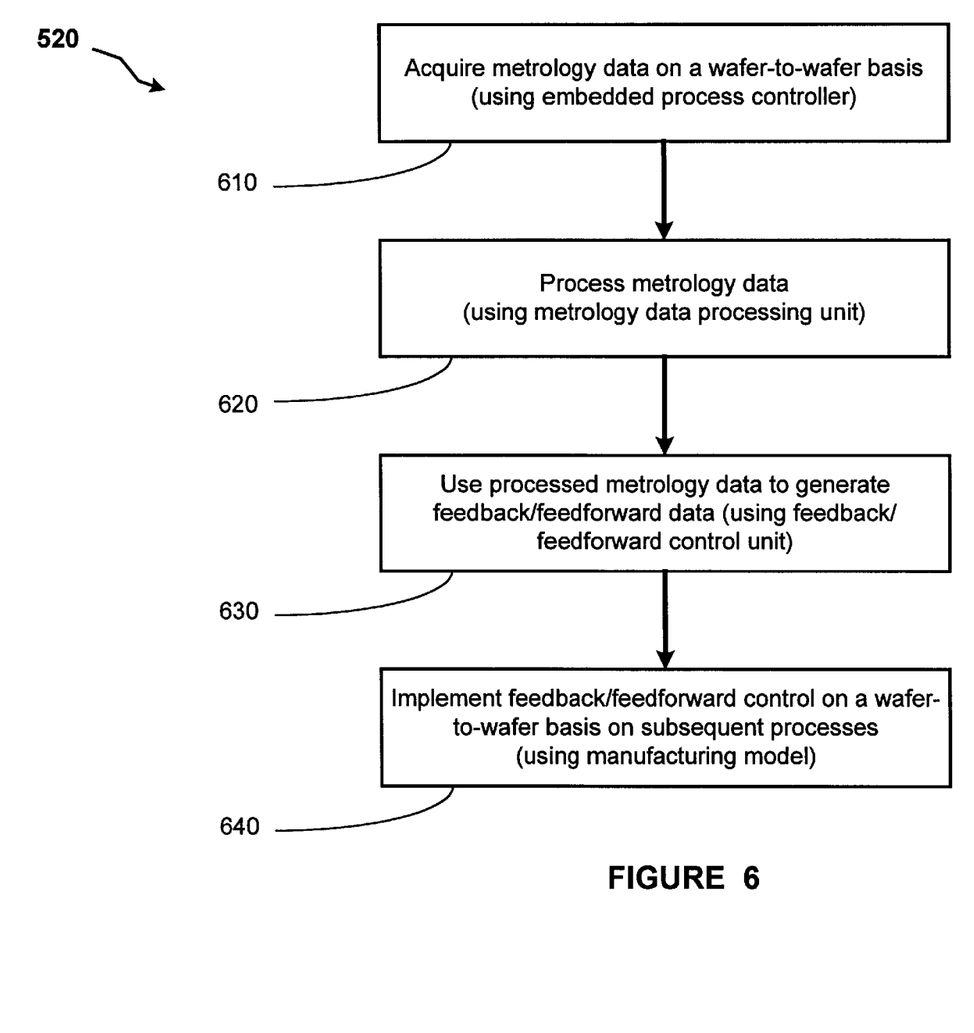
FIG. 6 illustrates a more detailed flowchart depiction of the step of performing an embedded process control procedure described in FIG. 5.

Turning now to FIG. 6, metrology data is acquired on a wafer-to-wafer basis, as described in block 610. In one embodiment, the metrology data is acquired by the metrology data acquisition unit 410 in the embedded process controller 310. Once the metrology data is acquired, the metrology data is processed and correlated with corresponding semiconductor wafers that are being processed, as described in block 620 of FIG. 6. In one embodiment, the processing of the acquired metrology data is performed by the metrology data processing unit 145 in the embedded process controller 310.

The processed metrology data is then used to generate feedback and feed-forward data or subsequent processing of semiconductor wafers, as described in block 630 of FIG. 6. In one embodiment, the feedback and feed-forward data is generated by the feedback/feed-forward controller 160 in the embedded process controller 310. The feedback/feed-forward data is implemented in the control of subsequent processing of semiconductor wafer, as described in block 640 of FIG. 6. In one embodiment, the implementation of the feedback/feed-forward data is performed by the manufacturing model, by making appropriate modifications to control input parameters that control the operation of the manufacturing tool 320. In one embodiment, the modification to the control input parameters is made by examining manufacturing errors that are defined by the feedback and feed-forward data, which is illustrated by FIG. 7.

Figure 7:
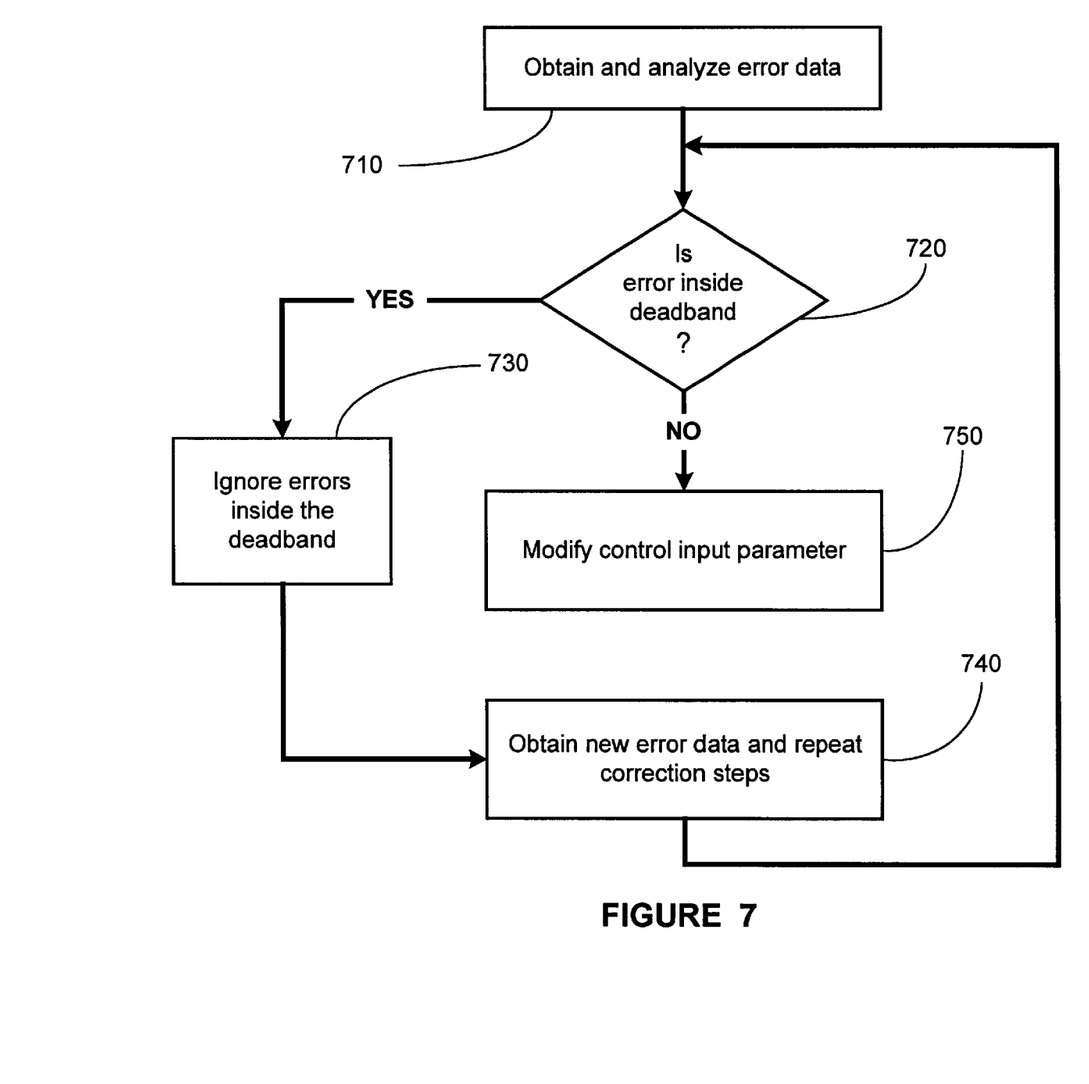
FIG. 7 illustrates a flowchart depiction of a method of modifying control parameters in response to errors detected.

Turning now to FIG. 7, manufacturing error data, as defined by the feedback and feed-forward data is acquired and analyzed, as described in block 710. The error data is acquired from one of plurality of methods known by those skilled in the art. Once the error data is acquired, a determination is made whether the error data is inside the deadband, as described in block 720 of FIG. 7. The step described in block 720 is performed to determine whether an error is sufficiently significant to warrant a change in the control input parameters that control the manufacturing tool 320. To define the deadband, the errors acquired from product analysis stations (not shown), such as the review station, are compared to a predetermined set of threshold parameters. In one embodiment, the deadband contains a range of error values associated with control input signals centered proximate to a set of corresponding predetermined target values, for which generally controller action is blocked.

If any one of the errors acquired from the product analysis station is smaller than its corresponding predetermined threshold value, that particular error is deemed to be in the dead-band. One of the primary purposes of the deadband is to prevent excessive control actions, resulting from changes to control input parameters that control the manufacturing tool 320, from causing a semiconductor manufacturing process to be inordinately jittery.

When a determination is made, as shown in block 720, that an error corresponding to control input signal is inside the deadband, that particular error is ignored, as described in block 730 of FIG. 7. Therefore, when the value of an error that corresponds to a control input signal is found to be in the predetermined deadband, that particular error is not used to update its corresponding control input signal. In one embodiment, when the error data is determined to be inside the deadband, no changes to the control parameters are made based upon that particular error data, as described in block 740 of FIG. 7. New error data is then obtained and analyzed, as described in block 740 of FIG. 7. In one embodiment, the steps described above are repeated for the new error data that is obtained.

When a determination is made, as shown in block 720, that an error corresponding to a control input signal is not inside the deadband, further processing, such as modifying the control input parameters to compensate for the errors, is performed, as described in block 750 of FIG. 7. The value of the error corresponding to a control input signal is used to update that control input parameters that control the manufacturing tool 320 for a subsequent manufacturing process step.

The completion of the steps described in FIGS. 6 and 7 substantially completes the step of performing the embedded process control procedure described in block 520 of FIG. 5. Turning back to FIG. 5, once the embedded process control procedure is implemented, subsequent processing of semiconductor wafer is commenced, as described in block 530 of FIG. 5. The principles taught by the present invention can be implemented in other types of manufacturing and process control settings.

The principles taught by the present invention can be implemented in an Advanced Process Control (APC) Framework. The present invention provides a method and an apparatus for implementing the APC framework as an embedded process control framework that is integrated into a manufacturing tool system 210, 220, 230. The APC is a preferred platform from which to implement the overlay control strategy taught by the present invention. In some embodiments, the APC can be a factory-wide software system, therefore, the control strategies taught by the present invention can be applied to virtually any of the semiconductor manufacturing tools on the factory floor. The APC framework also allows for remote access and monitoring of the process performance. Furthermore, by utilizing the APC framework, data storage can be more convenient, more flexible, and less expensive than local drives. The APC platform allows for more sophisticated types of control because it provides a significant amount of flexibility in writing the necessary software code.

Deployment of the control strategy taught by the present invention onto the APC framework could require a number of software components. In addition to components within the APC framework, a computer script is written for each of the semiconductor manufacturing tools involved in the control system. When a semiconductor manufacturing tool in the control system is started in the semiconductor manufacturing fab, it generally calls upon a script to initiate the action that is required by the process controller, such as the overlay controller. The control methods are generally defined and performed in these scripts. The development of these scripts can comprise a significant portion of the development of a control system. The principles taught by the present invention can be implemented into other types of manufacturing frameworks.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:

processing at least one semiconductor device;

performing an embedded process control procedure in response to said processing of said semiconductor device; and performing a subsequent process of semiconductor device in response to said embedded process control procedure.

2. The method described in claim 1, wherein processing at least one semiconductor device further comprises processing a semiconductor wafer.

3. The method described in claim 2, wherein processing a semiconductor wafer further comprises performing a photolithography process on said semiconductor wafer.

4. The method described in claim 1, wherein performing an embedded process control procedure further comprises:

acquiring metrology data;

processing said acquired metrology data;

generating a feedback and feed-forward data using said processed metrology data; and implementing a feedback and feed-forward control on at least one control input parameter that controls a manufacturing process using said feedback and feed-forward data.

5. The method described in claim 4, wherein acquiring metrology data further comprises acquiring scatterometry data.

6. The method described in claim 4, wherein acquiring metrology data further comprises acquiring critical dimension data.

7. The method described in claim 1, wherein acquiring metrology data further comprises acquiring misregistration data.

8. The method described in claim 1, wherein processing said acquired metrology data further comprises correlating said acquired metrology data to a corresponding processing of a semiconductor device.

9. The method described in claim 1, wherein generating a feedback and feed-forward data farther comprises generating data that can be used to modify an exposure dosage recipe.

10. The method described in claim 1, wherein generating a feedback and feed-forward data further comprises generating data that can be used to modify a focus during a photolithography process.

11. The method described in claim 1, wherein generating a feedback and feed-forward data further comprises generating data that can be used to modify a spacer deposition process.

12. An apparatus, comprising:

a computer system; and at least one manufacturing tool system interfaced with said computer, said manufacturing tool system comprising an embedded process control system capable of receiving commands from said computer system and control a manufacturing process performed by said manufacturing tool system.

13. The apparatus of claim 12, wherein said embedded process control system is an Advanced Process Control System (APC).

14. The apparatus of claim 12, wherein said manufacturing tool system further comprises:

a machine interface;

a manufacturing tool electronically coupled with said machine interface; and a embedded process controller coupled with said machine interface and said manufacturing tool, said embedded process controller being capable of performing process control upon said manufacturing tool using said machine interface.

15. The apparatus of claim 14, wherein said machine interface is capable of receiving control data from at least one of said computer system and said embedded process controller and using said control data to control said manufacturing tool.

16. The apparatus of claim 14, wherein said manufacturing tool is a photolithography tool.

17. The apparatus of claim 14, wherein said manufacturing tool is an etch tool.

18. The apparatus of claim 14, wherein said manufacturing tool is a process film deposition tool.

19. The apparatus of claim 14, wherein said embedded process controller further comprises:

a metrology data acquisition unit capable of acquiring metrology data from said manufacturing tool;

a metrology data processing unit coupled with said metrology data acquisition unit, said metrology data processing unit being capable of organizing and processing said acquired metrology data;

a feedback/feed-forward controller coupled with said metrology data processing unit, said feedback/feed-forward controller being capable of generating feedback and feed-forward adjustment data; and a manufacturing model coupled with said feedback/feed-forward controller, said manufacturing model being capable of using said generating feedback and feed-forward adjustment data to perform modification to at least one control input parameter that controls an operation of said manufacturing tool.

20. The apparatus of claim 19, wherein metrology data acquisition unit is a metrology tool.

21. The apparatus of claim 20, wherein said metrology tool is a scatterometry tool.

22. The apparatus of claim 20, wherein said metrology tool is capable of measuring a critical dimension on a semiconductor wafer.

23. An apparatus, comprising:

means for processing at least one semiconductor device;

means for performing an embedded process control procedure in response to said processing of said semiconductor device; and means for performing a subsequent process of semiconductor device in response to said embedded process control procedure.

* * * * *

UNITED STATES PATENT AND TRADEMARK OFFICE
CERTIFICATE OF CORRECTION

PATENT NO.    : 6,304,999 B1
DATED         : October 16, 2001
INVENTOR(S)   : Elfido Coss, Jr. and Anthony J. Toprac It is certified that error appears in the above-identified patent and that said Letters Patent is hereby corrected as shown below:

<u>Column 9,</u>
Line 55, delete "farther" and insert therefor -- further --.

Signed and Sealed this

Eleventh Day of February, 2003

JAMES E. ROGAN
*Director of the United States Patent and Trademark Office*